(12) United States Patent
Tanaka et al.

(10) Patent No.: US 7,459,712 B2
(45) Date of Patent: * Dec. 2, 2008

(54) METHOD AND APPARATUS OF MEASURING PATTERN DIMENSION AND CONTROLLING SEMICONDUCTOR DEVICE PROCESS HAVING AN ERROR REVISING UNIT

(75) Inventors: Maki Tanaka, Yokohama (JP); Hidetoshi Morokuma, Hitachinaka (JP); Chie Shishido, Yokohama (JP); Yuji Takagi, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/657,689

(22) Filed: Jan. 25, 2007

(65) Prior Publication Data

US 2007/0120078 A1    May 31, 2007

Related U.S. Application Data

(63) Continuation of application No. 10/986,910, filed on Nov. 15, 2004, now Pat. No. 7,173,268.

(30) Foreign Application Priority Data

Nov. 27, 2003    (JP)    ............................. 2003-397364

(51) Int. Cl.
  *G01N 21/86*    (2006.01)
(52) U.S. Cl. ................................ 250/559.4; 250/208.1

(58) Field of Classification Search .............. 250/559.4, 250/559.19, 559.3, 559.22, 559.44, 208.1, 250/306, 307, 310, 492.2, 492.3; 356/399–401; 382/145; 430/5, 30

See application file for complete search history.

(56) References Cited

U.S. PATENT DOCUMENTS 4,030,830 A * 6/1977 Holly ......................... 356/489
4,938,599 A    7/1990 Goszyk

OTHER PUBLICATIONS

Villarubia, J.S., et al "Scanning Electron Microscope Analog of Scatterometry," Proceedings of SPIE vol. 4689 (2002) pp. 304-312, USA.
Villarubia, J.S. et al "A Simulation Study Of Repeatability And Bias In The CD-SEM," Proceedings of SPIE vol. 5038 (2003), pp. 138-149, USA.

* cited by examiner

*Primary Examiner*—Que T Le
(74) *Attorney, Agent, or Firm*—Antonelli, Terry, Stout & Kraus, LLP.

(57) ABSTRACT

A method of measuring pattern dimensions includes evaluating a relationship between cross-sectional shapes of a pattern and measurement errors of a pattern in a specified image processing technique, and conducting an actual measurement in which dimension measurement of an evaluation objective pattern from image signals of a microscope is carried out, and revising errors of the dimension measurement of the evaluation objective pattern based on the relationship between the cross-sectional shapes of a pattern and the measurement errors of a pattern previously evaluated.

22 Claims, 15 Drawing Sheets

FIG. 5A
NORMAL TAPER
FIG. 5B
FLARED PORTION, ROUNDNESS
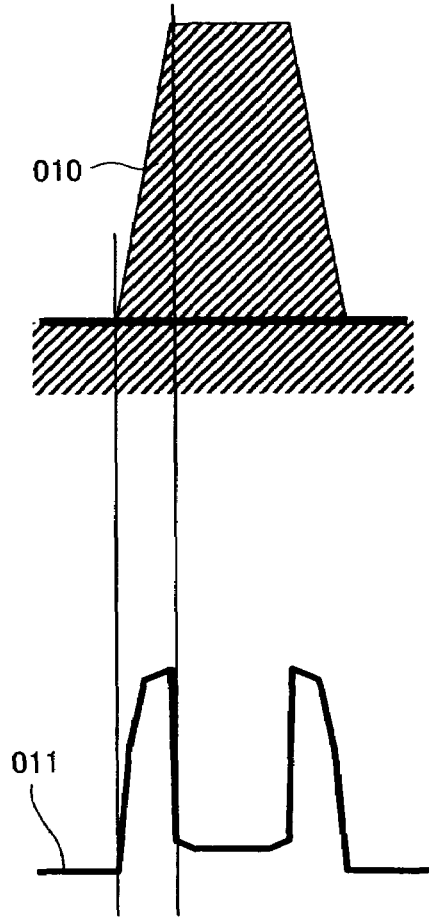
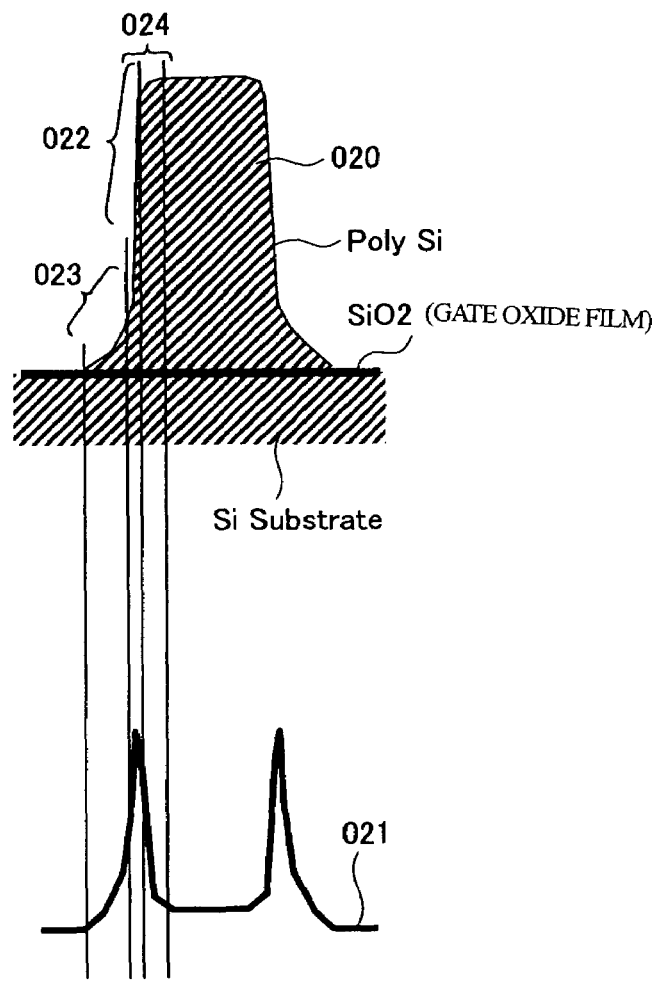

TILT ANGLE INDEX VALUE T

FIG.9B ACTUAL MEASUREMENT

FIG.9A PREPARATION OF MEASUREMENT RECIPE

BEAM IRRADIATION DIRECTION

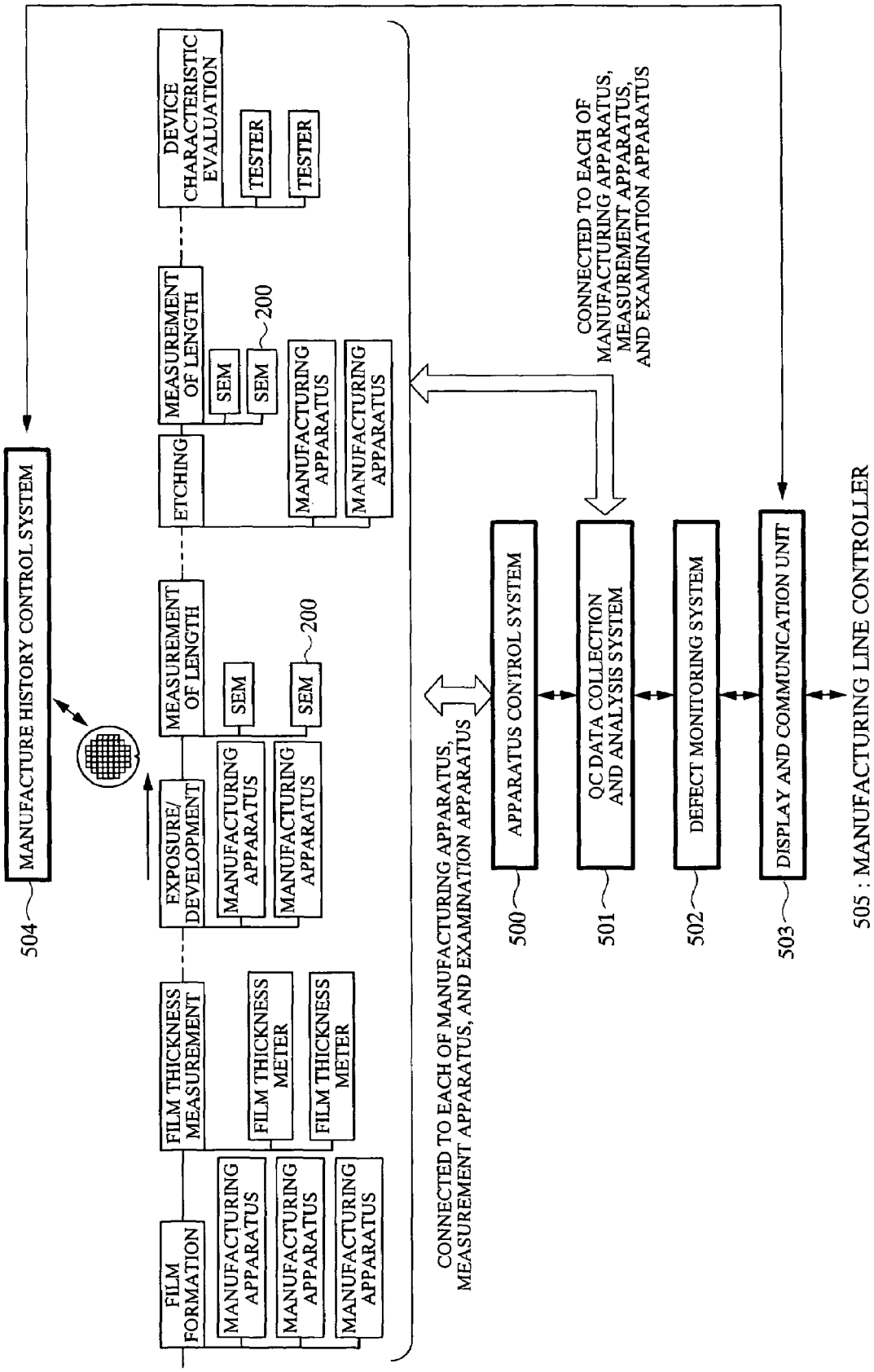

METHOD AND APPARATUS OF MEASURING PATTERN DIMENSION AND CONTROLLING SEMICONDUCTOR DEVICE PROCESS HAVING AN ERROR REVISING UNIT

CROSS-REFERENCE TO RELATED APPLICATION

This application is a continuation application of U.S. application Ser. No. 10/986,910, filed Nov. 15, 2004, now U.S. Pat. No. 7,173,268, the contents of which are incorporated herein by reference.

The present application claims priority from Japanese Patent Application JP 2003-397364 filed on Nov. 27, 2003, the content of which is hereby incorporated by reference into this application.

TECHNICAL FIELD OF THE INVENTION

The present invention relates to a manufacturing technique of a semiconductor device. More specifically, it relates to a technique effectively applied to a method and a system for evaluating processed shape conditions of a circuit pattern formed on a wafer by the use of electron beam images of the circuit pattern in a semiconductor manufacturing process.

BACKGROUND OF THE INVENTION

Examinations by the inventors of the present invention have learned that measurement and control of pattern dimensions by the use of an electronic microscope exclusive for the measurement (length measuring SEM) is generally conducted today in the semiconductor manufacturing processes. The measurement of pattern dimensions has been automated by applying image processing technologies to acquired images of the length measuring SEM, and therefore, expert skills of operators have become unnecessary, and measurement variance due to the individual differences has been decreased. Objectives of such pattern measurement are mostly patterns of a resist, an insulating film, polysilicon and the like, and the width of wire, diameters of circular holes and so forth are measured.

An example of the measurement techniques is shown in FIGS. 14A, 14B and 14C. Image signals of the SEM is changed according to the pattern shapes and materials, and they shine brightly especially at edge portions of a pattern. FIG. 14 shows an example of processing a signal waveform of a wire shape pattern. In the signal waveform, two peaks with large signal amounts correspond to edge portions of the wire, and the edge positions are defined in the manner as shown in FIG. 14 so as to measure the dimensions of the objective pattern. The technique of FIG. 14A is a method to detect the maximum inclined position of a peak (maximum gradient method), FIG. 14B shows a threshold method to detect an edge position by the use of a specified threshold value (th), and FIG. 14C shows a linear approximation method in which a straight line is applied to an edge portion and a base portion and a point of intersection therebetween is detected.

In the prior dimension measurement method using the SEM images and image processing technologies as described above, peaks and positions of image signal waveforms and signal amounts or changes thereof are used to determine the positions to be measured. However, in these techniques, it is not possible to precisely grasp which portion an actually measured dimension corresponds to in an actual cross section (a top portion, a bottom portion or other of the pattern). Especially, in the case where a cross-sectional shape of the pattern changes, errors in dimensions to be measured become different depending on the cross-sectional shape of the pattern, which has been a problem with the prior art.

FIG. 15 shows an example of influences that the changes in cross-sectional shapes of the pattern give to the measurement, practiced in 2002 by Villarrubia et al. (Scanning electron microscope analog of scatterometry", Proc. SPIE 4689, pp. 304-312). FIG. 15 shows an example of simulation illustrating the case where dimensions are measured by the threshold method (threshold value 50%), in which errors at the measured position and the actual bottom position in the cross section are different between the case where a pattern sidewall is vertical (left side of FIG. 15) and the case where it is inclined (right side of FIG. 15). Such positional difference comes from the fact that the measurement algorithm in the prior length measuring SEM does not consider how a signal waveform changes according to the differences of pattern cross-sectional shapes.

FIG. 16 shows relationships between the tilt angle of the pattern sidewall (horizontal axis of FIG. 16) and pattern dimension measurement errors (vertical axis of FIG. 16) by various image processing algorithms (max. Deriv., Regressiont, Sigmoid, Model-Based Lib.), and illustrates that the measurement errors change depending on cross-sectional shapes of the pattern and the algorithms. Along with the scaling down in the semiconductor manufacturing processes, influences that the measurement errors according to the pattern shapes give to the process control have become more and more significant. Therefore, it is necessary to solve such errors and realize dimension measurement with small errors. Further, for the achievement of higher precision in the process, it is required not only to realize the dimension measurement with small errors but also to realize the quantitative evaluations of errors in cross-sectional shapes as shown in FIG. 15.

In other words, as a technology for solving the technical problem concerning FIG. 15, Villarrubia et al. have proposed a measurement method using an electron beam simulation. This is a method in which signal waveforms in which errors in the cross section of the pattern are taken into consideration are generated by an electron beam simulation and thereby creating libraries, and the signal waveforms of actual SEM are compared with the waveforms in the libraries, and an actual cross-sectional shape of the pattern is estimated from similar waveforms, and then, the correct dimensions are calculated. The Model-Based Lib. in FIG. 16 is the evaluation result of the measurement errors, and a more precise measurement than other techniques can be achieved. In this way, by this technique, it is possible to reduce the measurement errors due to the cross-sectional shapes and to evaluate the cross-sectional shapes. However, it is required to prepare in advance the signal waveforms of SEM to various cross-sectional shapes as libraries. For highly precise measurement, it is necessary to prepare the libraries having a sufficient amount of data. As a result, the amount of data will become enormous and it will take much time to prepare libraries. Furthermore, in the measurement, the prepared waveforms must be compared with actual waveforms, and therefore, calculations take much more time than conventional measurement techniques. The present invention is one of other measurement techniques that requires relatively small calculation amount than the technique of them.

SUMMARY OF THE INVENTION

In the present invention, a highly precise pattern dimension measurement technique which is stable to the changes of the cross-sectional shapes of the pattern as mentioned above is provided, which has been difficult to be realized in the prior technique (technology concerning FIG. 15), and further, the pattern dimension measurement technique in which the calculation amount can be reduced in comparison to the above-mentioned technique (technology concerning FIG. 16) so as to reduce the calculation time. In addition, it is also possible to evaluate the changes in the cross-sectional shapes of the pattern in a quantitative manner. Further, it is also possible to realize a highly precise process control on the basis of these highly precise calculation results.

In a semiconductor pattern measurement method according to the present invention, the relationship between the cross-sectional shapes of the pattern and the measurement errors in a specified image processing technique are evaluated in advance, and in the actual dimension measurement, dimensions of an evaluation objective pattern are measured from the image signals of a scanning electron microscope, and errors of the dimensional measurement of the evaluation objective pattern are revised on the basis of the relationship between the cross-sectional shapes of the pattern and the measurement errors evaluated in advance. Further, in a pattern shape evaluation using tilt images, pattern shapes are evaluated in the same manner, and dimension measurement errors depending on the shapes are revised, thereby achieving the highly precise measurement.

In concrete, the present invention is applied to a semiconductor pattern measurement method for measuring dimensions of an evaluation objective pattern by the use of electron beam images of the evaluation objective pattern that are obtained by a scanning electron microscope. In this method, a database is established, in which the relationship between a deviation, i.e., a measurement error between the position of the end portion of a pattern detected by the specified image processing technique and the position of the end portion of the actual pattern and a cross-sectional shapes of the pattern is evaluated and recorded in advance, and in the actual dimension measurement, evaluation of the cross-sectional shapes of the evaluation objective pattern and the position detection of the end portion of the pattern by the specified image processing technique are carried out, and a measurement error in the case of measuring a pattern having the cross-sectional shapes is estimated based on the relationship of the cross-sectional shapes of the pattern and the measurement errors recorded in advance in the database, and then, this measurement error is revised.

Further, in the semiconductor pattern measurement method, the cross-sectional shape includes one of a tilt angle of a sidewall, the roundness at a corner of a pattern top portion, and the roundness at a corner of pattern bottom portion, or a combination thereof. Also, the database is established by an electron beam simulation or by the cross section measurement, the AFM measurement or the measurement by scatterometry. Furthermore, the evaluation of the cross-sectional shapes in the measurement is carried out by the use of the feature quantity of the image calculated from SEM images or by the scatterometry.

Furthermore, in the semiconductor pattern measurement method, the cross-sectional structure information of an objective to be measured and the electron beam images and/or waveforms thereof obtained from an SEM observation of this cross-sectional structure or a simulation of the SEM observation are displayed together, and the position of the end portion of the pattern detected by designated image processing conditions is displayed on a cross-sectional structure and electron beam images or waveforms, thereby adjusting the image processing conditions. Furthermore, the dimension measurement image processing algorithms or image processing parameters whose variations due to the noises or the device parameters of SEM are small are employed. Moreover, the relationship between cross-sectional shapes and dimension measurement errors are recorded in the form of functions into a database.

Further, in the semiconductor pattern measurement method, the relationship between the cross-sectional shapes of the pattern and the signal waveforms obtained from actual images or an electron beam simulation are recorded, and after image processing algorithms and parameters of dimension measurement are determined, the relationship between the cross-sectional shapes and dimension measurement errors are calculated based on a combination of the cross-sectional shapes and the signal waveforms, and recorded into a database. Furthermore, cross-sectional shapes are evaluated by the use of plural electron beam signals where angles between an electron beam emitted from a scanning electron microscope and the surface of a measurement sample are different.

These and other objects, features and advantages of the invention will be apparent from the following more particular description of preferred embodiments of the invention, as illustrated in the accompanying drawings.

BRIEF DESCRIPTIONS OF THE DRAWINGS

Figure 6:
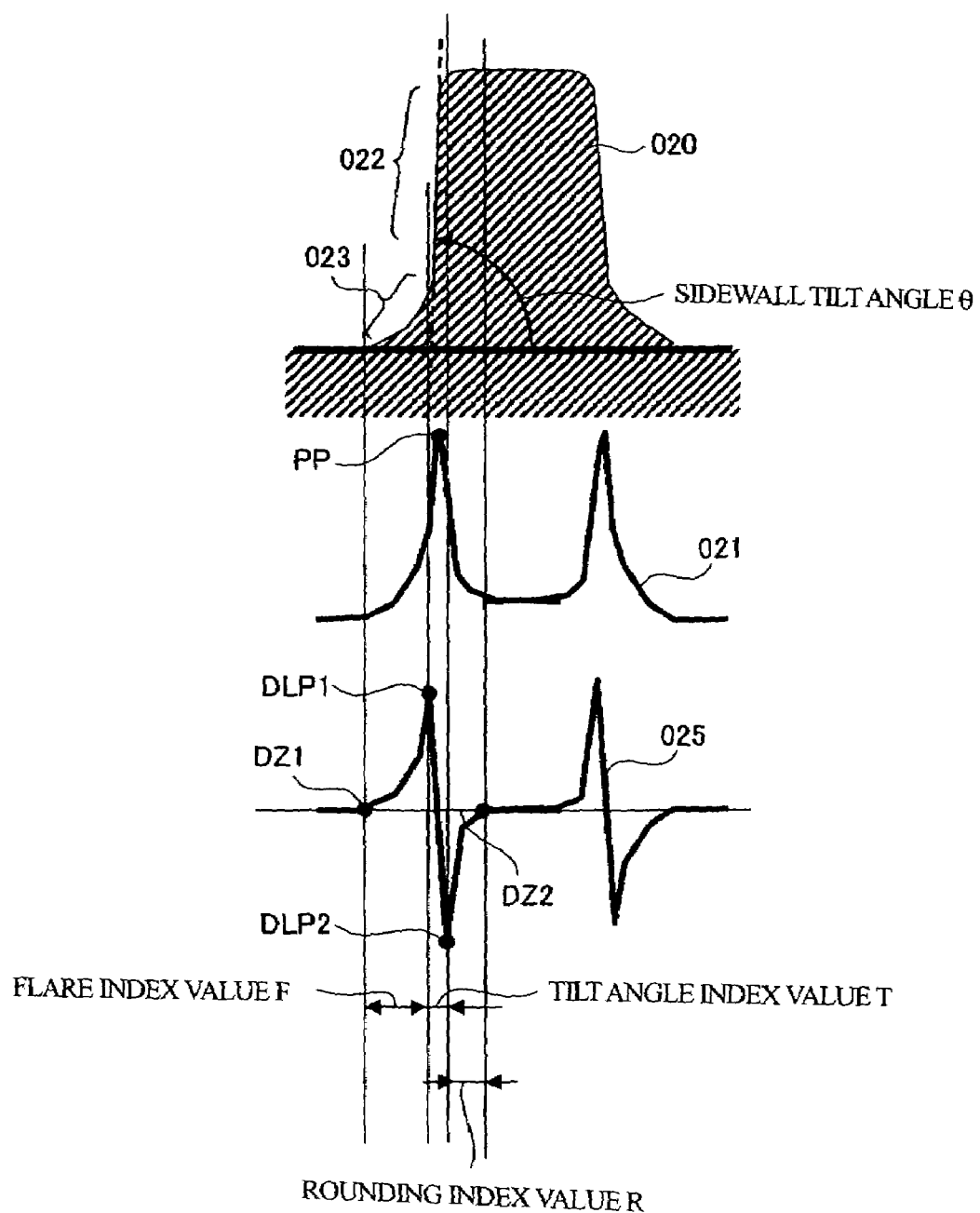
Figure 7:
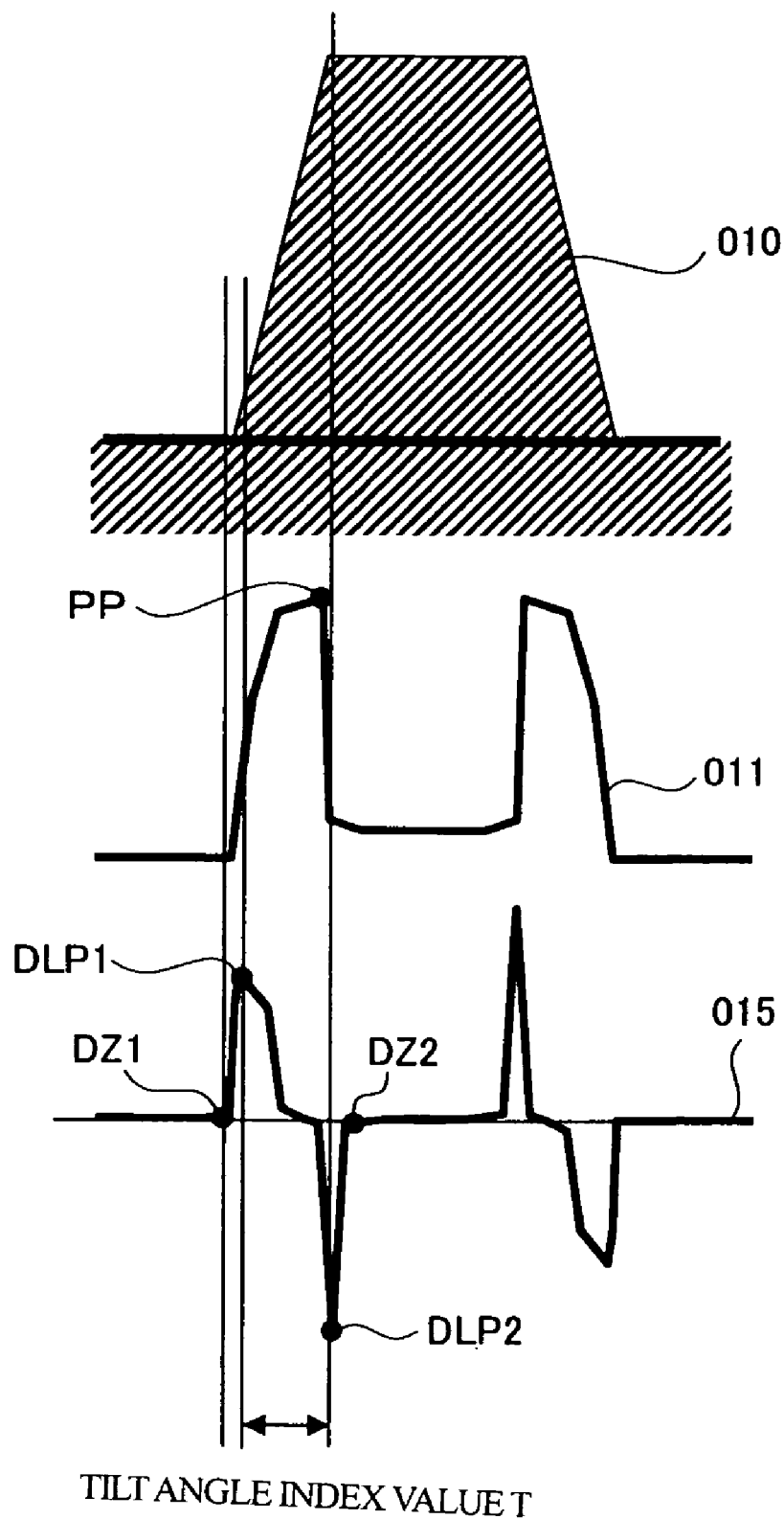
Figure 8:
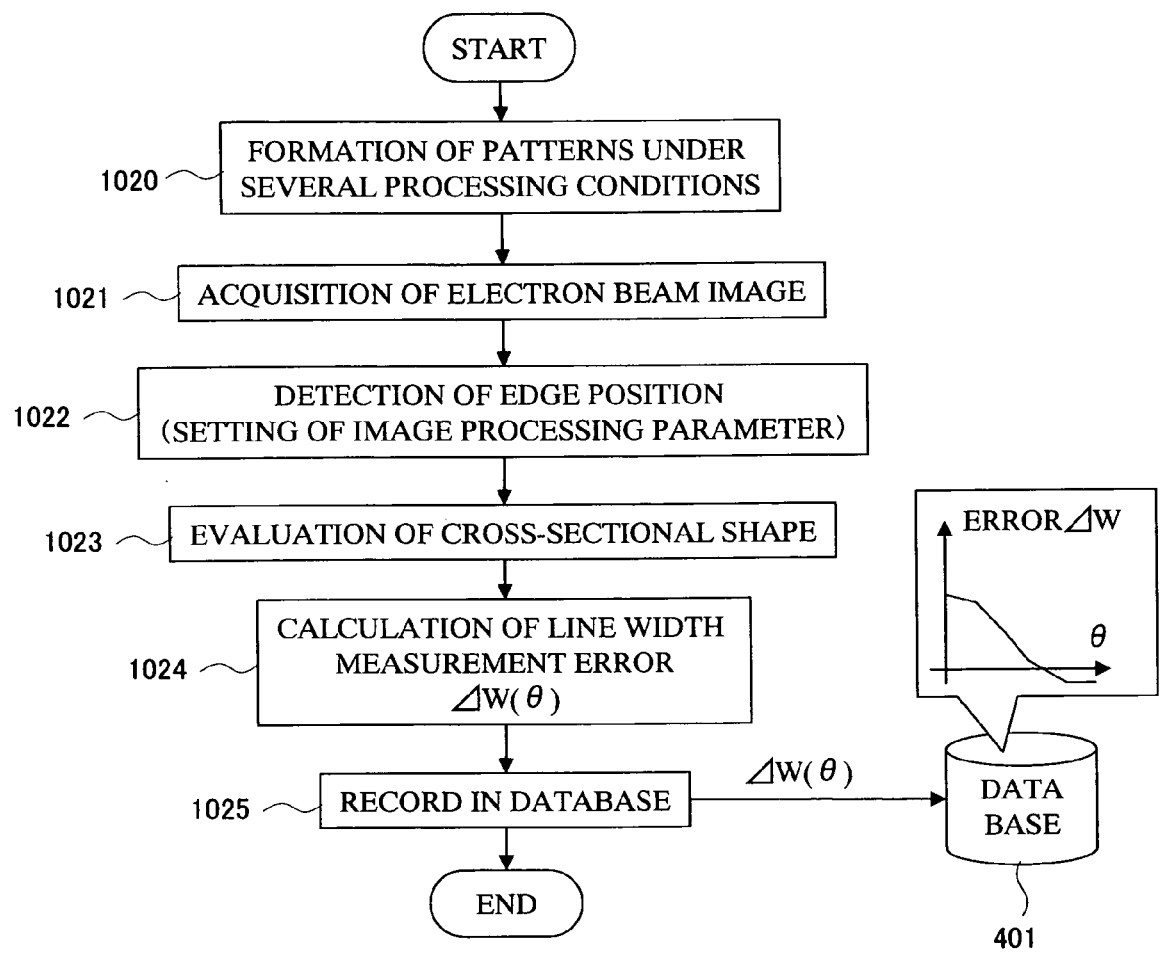
Figure 10:
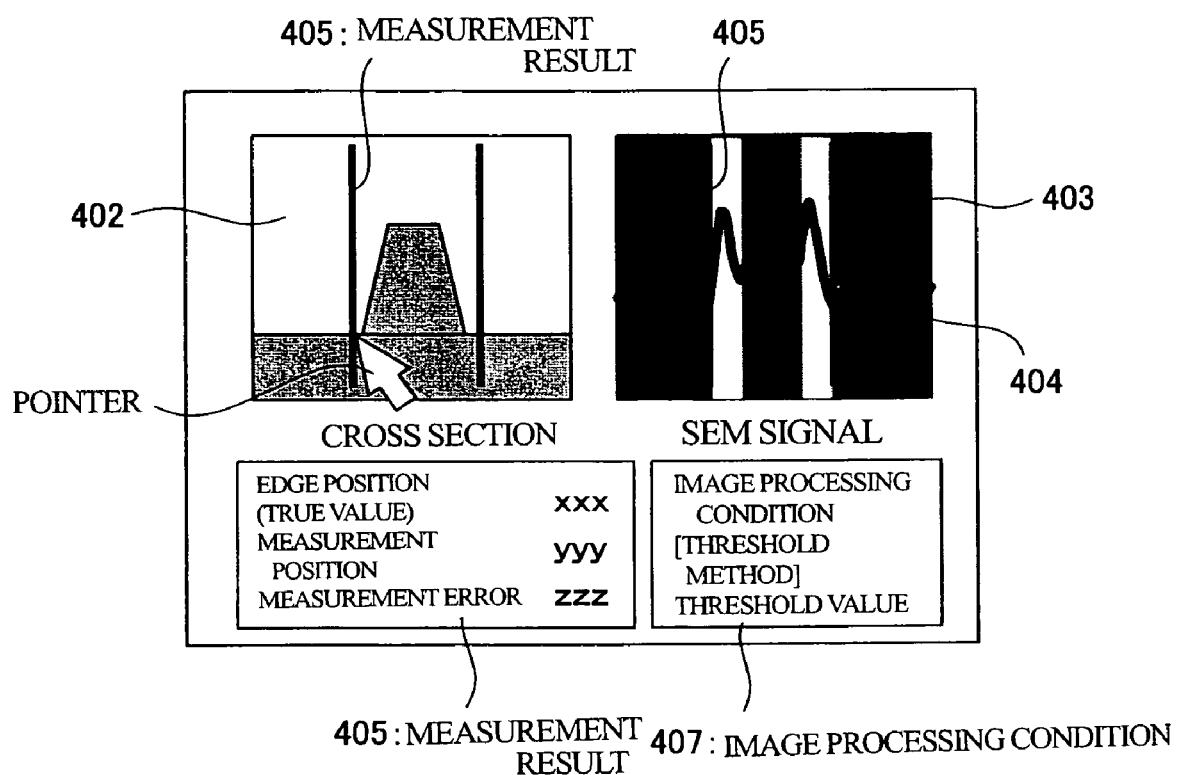
Figure 11A:
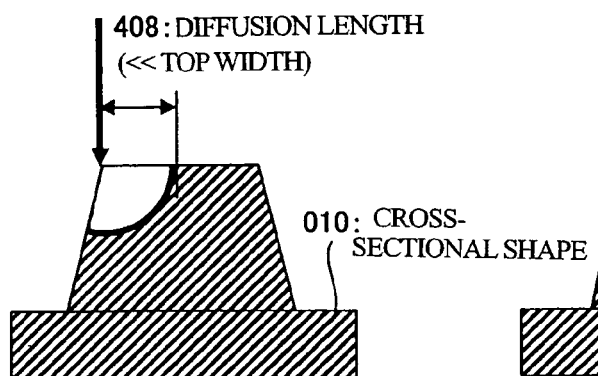
Figure 11B:
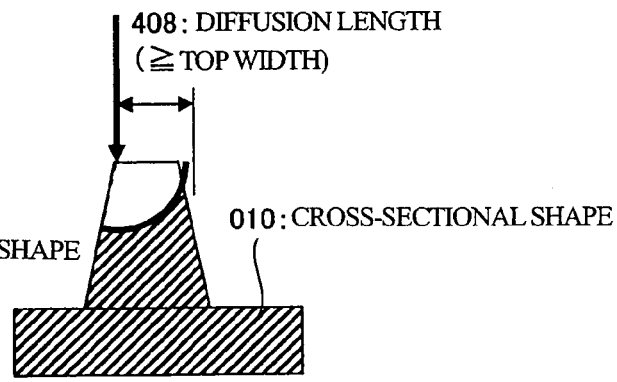
Figure 12:
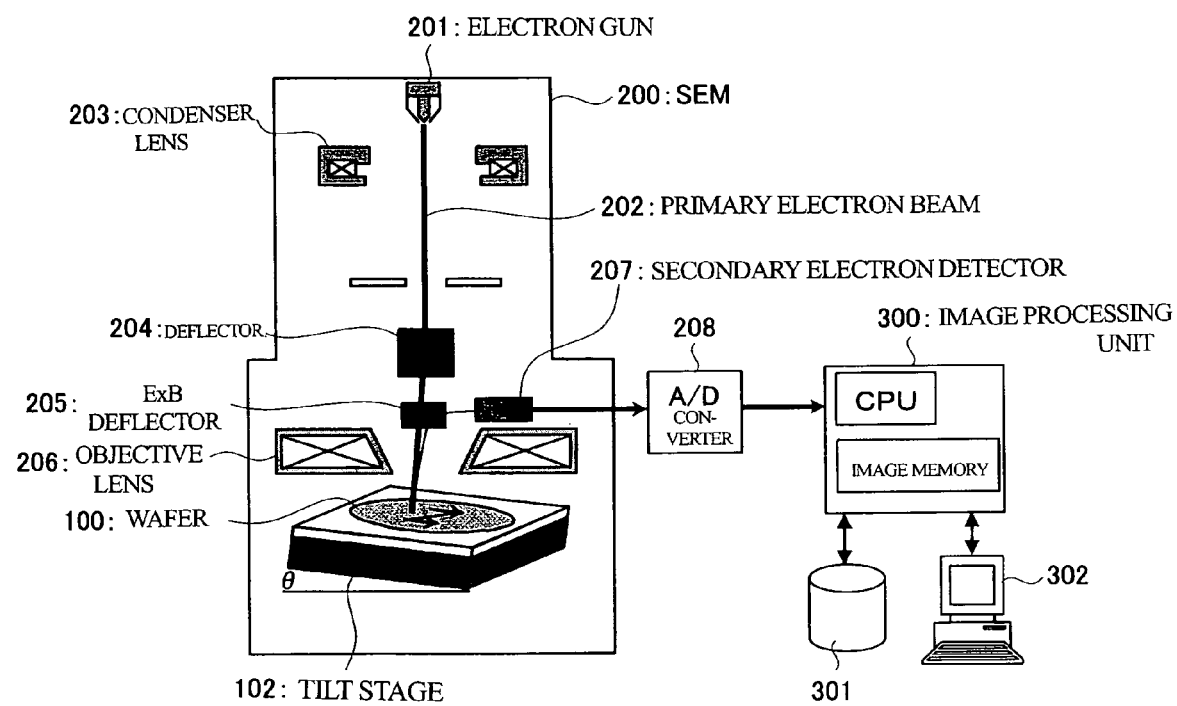
Figure 13A:
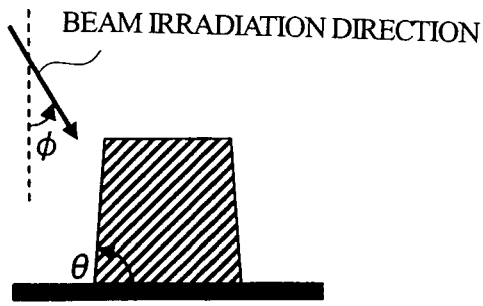
Figure 13B:
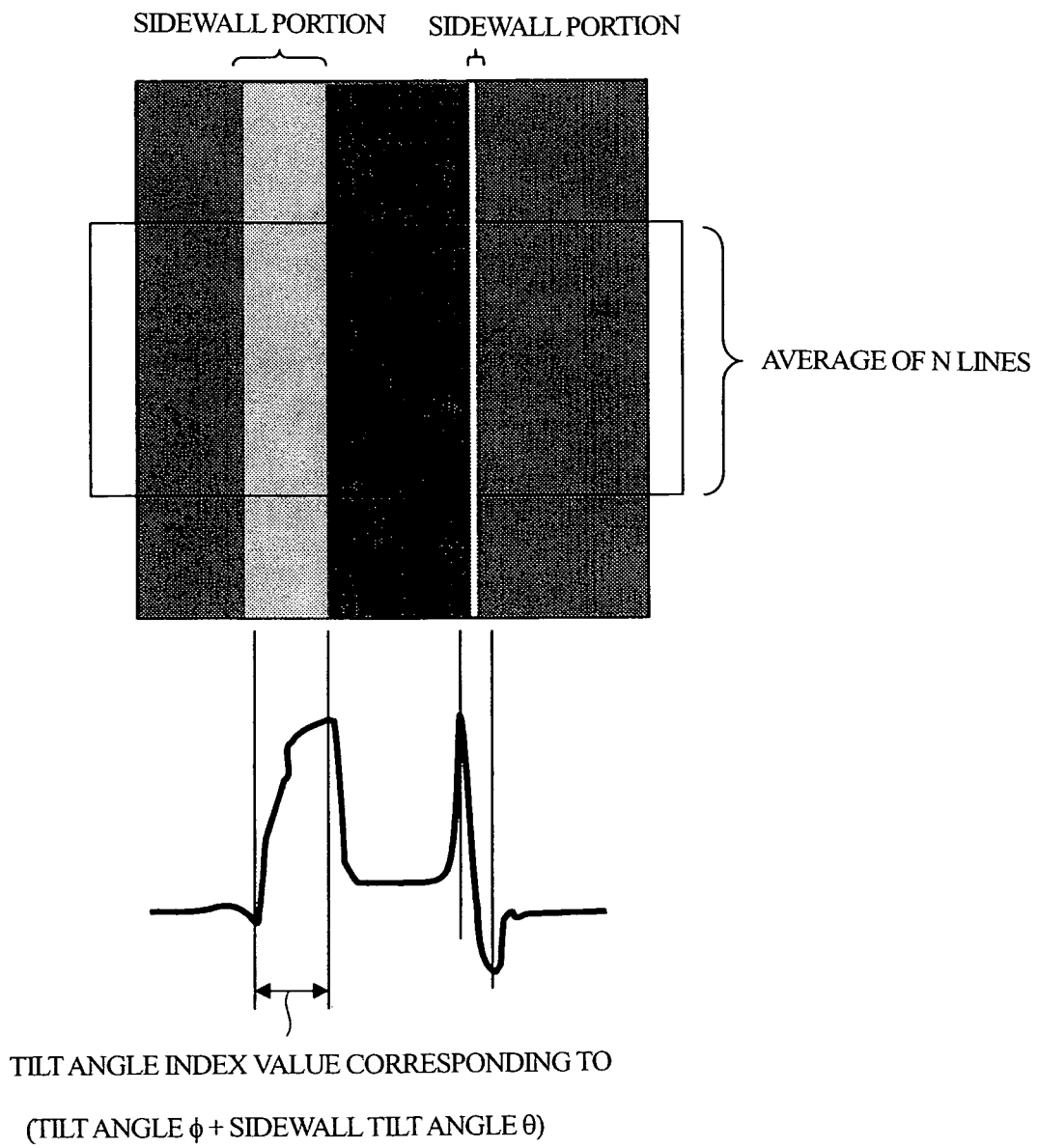
Figure 14A:
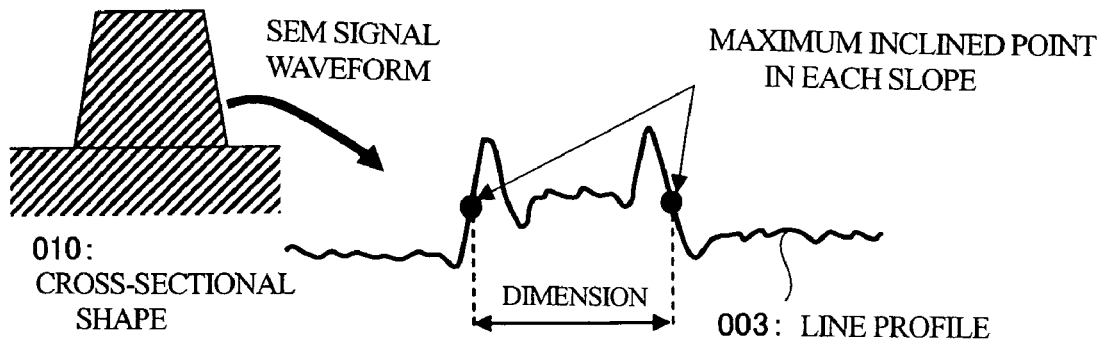
Figure 14B:
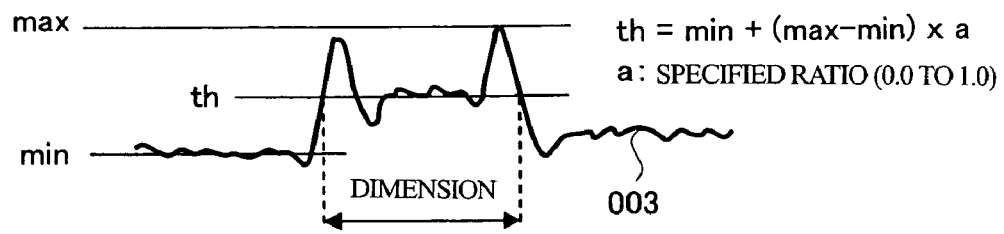
Figure 14C:
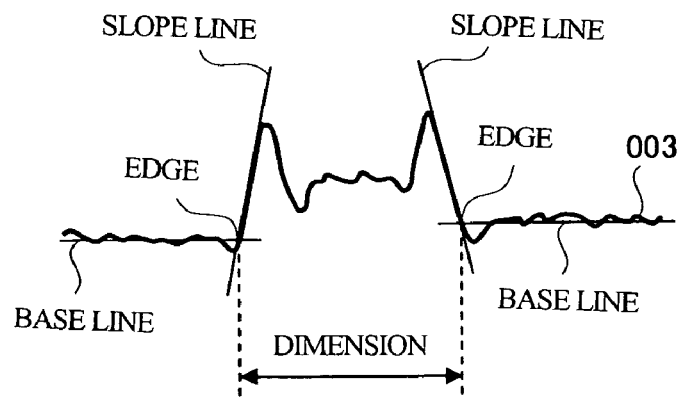
Figure 15:
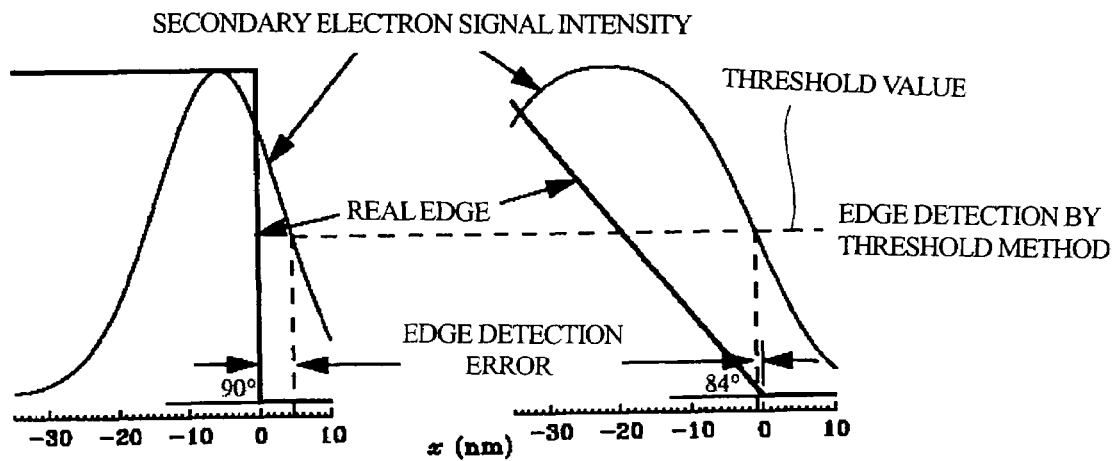
Figure 16:
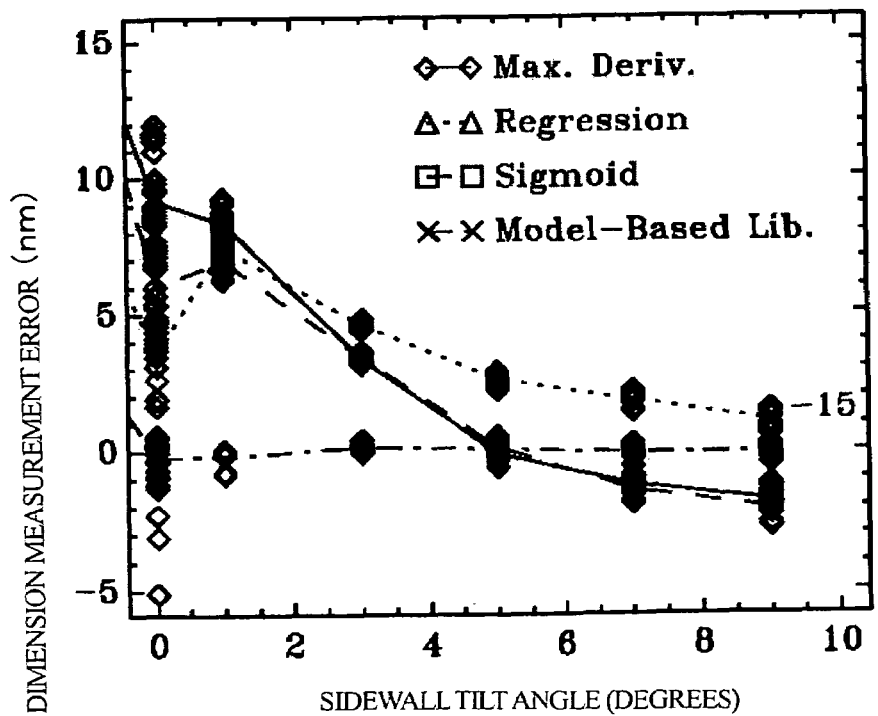

The upper stage of FIG. 5A shows a cross-sectional shape of the normally tapered pattern, the lower stage thereof shows a signal waveform of an SEM image, while the upper stage of FIG. 5B shows a cross-sectional shape of the reversely tapered pattern, and the lower stage thereof shows a signal waveform of an SEM image;

FIG. 6 is an explanatory diagram showing details of evaluation procedures of a pattern shape (flared shape) in the first embodiment of the present invention, in which the upper stage shows a cross-sectional view of a pattern, the middle stage shows a signal waveform of an SEM image, and the lower stage shows a primary differential waveform of the signal in the middle stage;

FIG. 7 is an explanatory diagram showing details of evaluation procedures of a pattern shape (normally tapered shape) in the first embodiment of the present invention, in which the upper stage shows a cross-sectional view of a pattern, the middle stage shows a signal waveform of an SEM image, and the lower stage shows a primary differential waveform of the signal in the middle stage;

FIG. 8 is a flow chart showing the procedures of establishing a database in a second embodiment of the present invention;

FIG. 9A is a flow chart showing procedures of replaying measurement recipe in a third embodiment of the present invention, and FIG. 9B is a flow chart showing procedures when measuring an actual pattern in the third embodiment of the present invention;

FIG. 10 is an explanatory diagram showing a display screen for setting image processing conditions in a fourth embodiment of the present invention;

FIG. 11A is an explanatory diagram showing the case where electron diffusion length in a solid matter is smaller than a pattern top width in a fifth embodiment of the present invention, in which the upper stage shows a cross-sectional view of a pattern and the lower stage shows a signal waveform of an SEM image, while FIG. 11B is an explanatory diagram showing the case where electron diffusion length in a solid matter is larger than a pattern top width in a fifth embodiment of the present invention, in which the upper stage shows a cross-sectional view of a pattern and the lower stage shows a signal waveform of an SEM image;

FIG. 12 is a block diagram showing an SEM having a tilt image acquisition function to be used in dimension measurement in a sixth embodiment of the present invention;

FIG. 13A is a diagram showing the relationship between a cross section of a pattern and an electron beam incidence direction when acquiring tilt images to be used in the dimension measurement in the sixth embodiment of the present invention, and the upper stage of FIG. 13B shows an SEM image of a pattern and the lower stage thereof shows a signal waveform of an SEM image;

FIG. 14A is a cross-sectional view of a pattern, and FIG. 14B shows a signal waveform of an SEM image and its maximum inclined point, and FIG. 14C shows a signal waveform of an SEM image and its maximum value and minimum value, while FIG. 14D shows a signal waveform of an SEM image and its slope line;

FIG. 15 is an explanatory diagram showing errors in the case where a pattern sidewall is vertical and the case where it is inclined in a referential technology to the present invention;

FIG. 16 is an explanatory diagram showing the relationship between the tilt angles of the pattern sidewall and errors in the pattern dimension measurement in a referential technology to the present invention; and FIG. 17 is a block diagram showing a manufacturing line system connected to the network in a seventh embodiment of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Basic Structure (Entire Process Flow)

Figure 1:
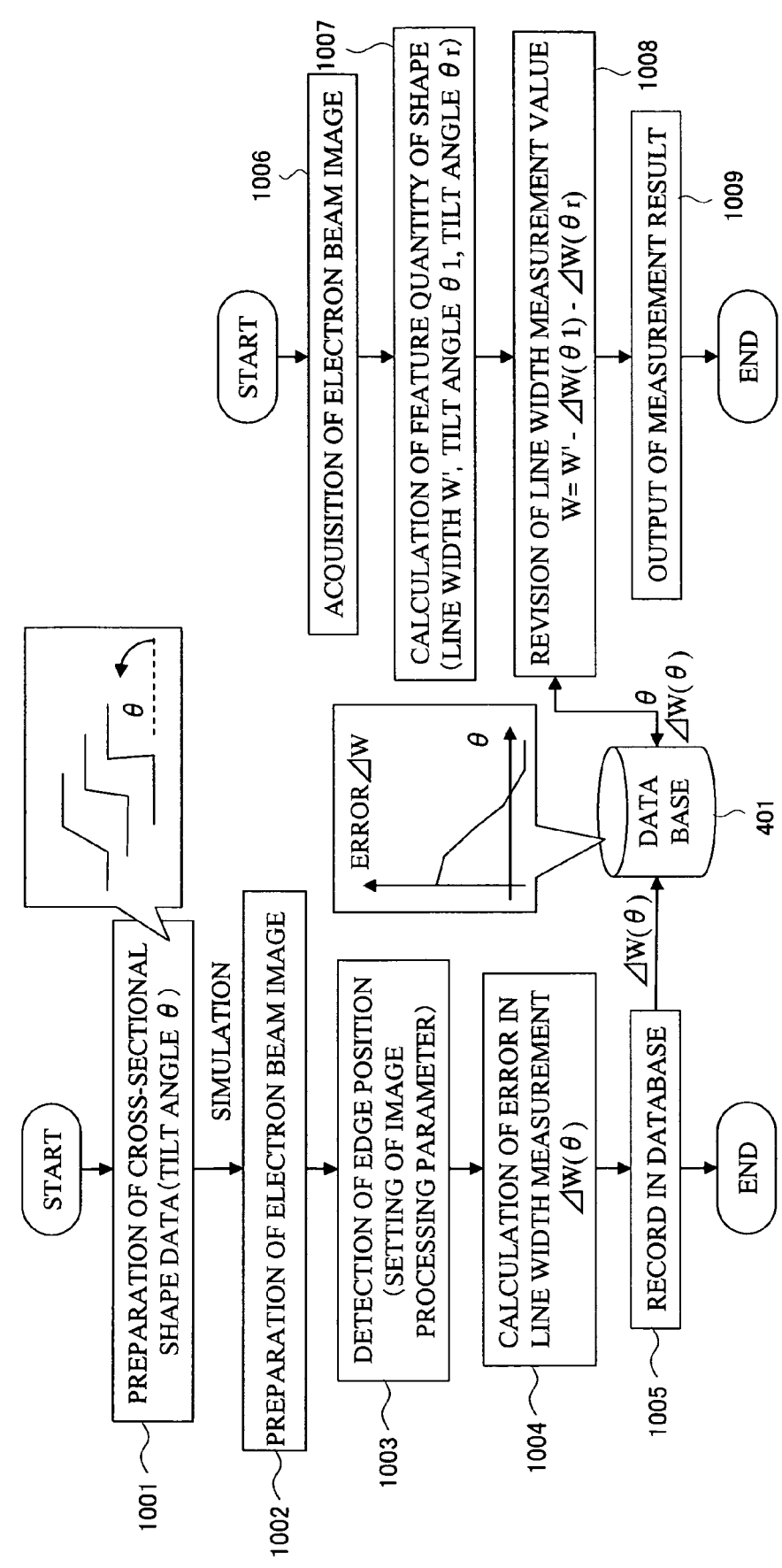
FIG. 1A is a flow chart showing dimension measurement procedures when preparing measurement recipe.
FIG. 1B is a flow chart showing dimension measurement procedures when measuring an actual pattern.
Figure 2:
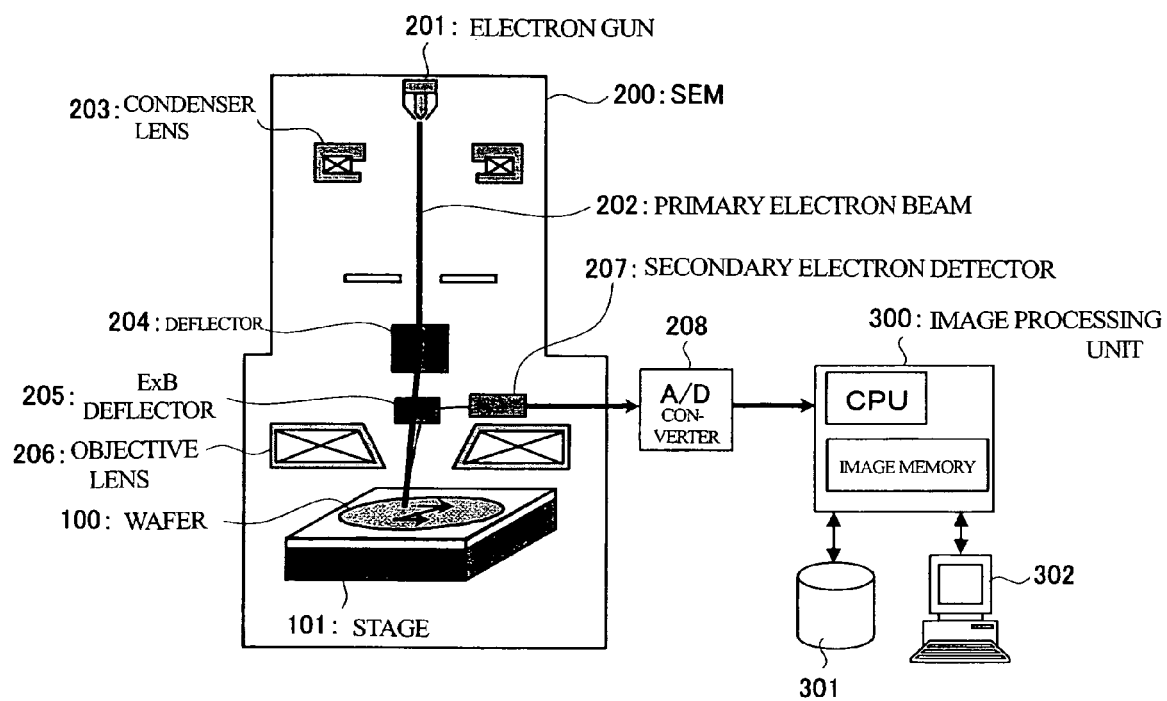
FIG. 2 is a block diagram showing an SEM to be employed in dimension measurement in a first embodiment of the present invention.

FIG. 1 is a schematic diagram of measurement procedures using a pattern measurement system established on a length measuring SEM 200 (whose schematic structure is shown in FIG. 2) in a first embodiment of the present invention. In an example of this embodiment, two steps are required, that is, the measurement recipe preparing step for preparing a measurement recipe in which measurement conditions and procedures for the automatic measurement are recorded (FIG. 1A), and the step of actually measuring a measurement objective pattern (FIG. 1B).

First, the procedures in the step of preparing measurement recipe (FIG. 1A) will be described below. When preparing the measurement recipe, a database 401 in which the relationship between the cross-sectional shapes of a measurement objective pattern and dimension measurement errors is recorded is prepared. In the example of FIG. 1, a method using an electron beam simulation will be described.

First, cross-sectional shape data of the measurement objective is prepared (step 1001). Here, changes in cross-sectional shapes of a measurement objective pattern in an actual semiconductor manufacture process are estimated and the models of representative shapes are prepared. In FIG. 1, for simplicity, as cross-sectional shape data, a case where only a tilt angle θ of a sidewall changes is considered. In consideration of change range of sidewall tilt angle of an actual pattern, for example, if the sidewall tilt angle θ changes in the range from 80 degrees to 95 degrees, several through ten and several pieces of cross-sectional shape data of the sidewall tilt angle are prepared within the range. Note that, in FIG. 1, only the data for one sidewall of a wire pattern is shown. When pattern dimension is small, it is necessary to consider adjacent sidewall portion, and details of the establishment of this database 401 will be described in the fifth embodiment.

Further, for the cross-sectional shape data, an SEM image signal obtained by the use of an electron beam simulator is generated (step 1002). In an electron beam simulation, secondary electron signals relative to electron beam radiation conditions (acceleration voltage and the likes) in the actual measurement may be calculated by means of Monte Carlo method and so forth. Next, an image process employed in the actual measurement is conducted to the simulation results of SEM image signals obtained as described above, and the positions of pattern edge are detected (step 1003). With regard to the method of setting algorithms, details thereof will be described separately in the fourth embodiment later.

Then, in the simulation, the positional difference (error: ΔW (θ)) between a detected edge and an actual edge (for example, the position of a pattern bottom edge) can be easily calculated (step 1004). In this manner, it is possible to know what errors the used dimension measurement algorithm has relative to the variations of cross-sectional shapes. In the recipe preparation, the relationship between the cross-sectional shape of the pattern and the edge position detection errors obtained in this manner are registered into the database (step 1005).

In FIG. 1, the relationship between the sidewall tilt angles θ and measurement errors are displayed schematically in a graph. However, in an actual database, sets of prepared data are recorded as they are, and the sidewall tilt angles θ other than the prepared data are used by interpolating data, alternatively, a relation expression may be calculated out in the form of a function from these data sets, and the resulting function is recorded and used.

Subsequently, procedures to carry out actual measurement by the use of this database (FIG. 1B) will be described. The measurement is conducted by acquiring an SEM image at a desired measurement position in the same manner as conventional dimension measurement by an SEM (step 1006). Next, from the obtained SEM image, dimension (line width W') of an objective pattern and estimated values of sidewall tilt angles (left edge θl, right edge θr) are obtained (step 1007). This estimation of these sidewall tilt angles is to be described separately later. Next, the error of this line width W' is estimated by the use of estimated sidewall tilt angle and the database prepared when preparing the recipe, and revised by W=W'−ΔW (θl)−ΔW (θr) (step 1008). By outputting the dimension measurement result revised in this manner, it becomes possible to obtain a dimension with small error due to the variation of the cross-sectional shape of the pattern (step 1009).

(System Block Diagram of an SEM Main Body)

FIG. 2 is a block diagram of a length measuring SEM 200 to be employed in this pattern shape evaluation system. This length measuring SEM 200 comprises an electron gun 201, a condenser lens 203, a deflector 204, an ExB deflector 205, an objective lens 206, a secondary electron detector 207 and so forth, and is connected via an A/D converter 208 to an image processing unit 300.

In FIG. 2, a primary electron beam 202 that is emitted from the electron gun 201 is converged by the condenser lens 203 and is radiated via the beam deflector 204, the ExB deflector 205, the objective lens 206, to focus on a wafer 100 put on a stage 101. When the electron beam is radiated, secondary electrons are generated from the wafer 100. The secondary electrons generated from the sample wafer 100 are deflected by the ExB deflector 205 and are detected by a secondary electron detector 207. By detecting electrons generated from the wafer in synchronization with two-dimensional scanning of electron beam by the deflector 204 or repeated scanning of electron beam in an X direction by the deflector 204 and continuous movement of the wafer 100 in a Y direction by the stage 101, a two-dimensional electron beam image is obtained. Signals detected by the secondary electron detector 207 are converted into digital signals by the A/D converter 208 and transferred to the image processing unit 300.

This image processing unit 300 includes an image memory that temporarily stores digital images and a CPU that calculates line profiles and feature quantity from images on the image memory. Further, it has a memory medium 301 that stores detected images or line profiles or calculated pattern shape information and so forth. A display device 302 is connected to the image processing unit so as to operate the necessary devices and confirm the detection results by the graphical user interface (hereinafter referred to as GUI).

(Acquisition of Solid Shape Information)

Figure 3:
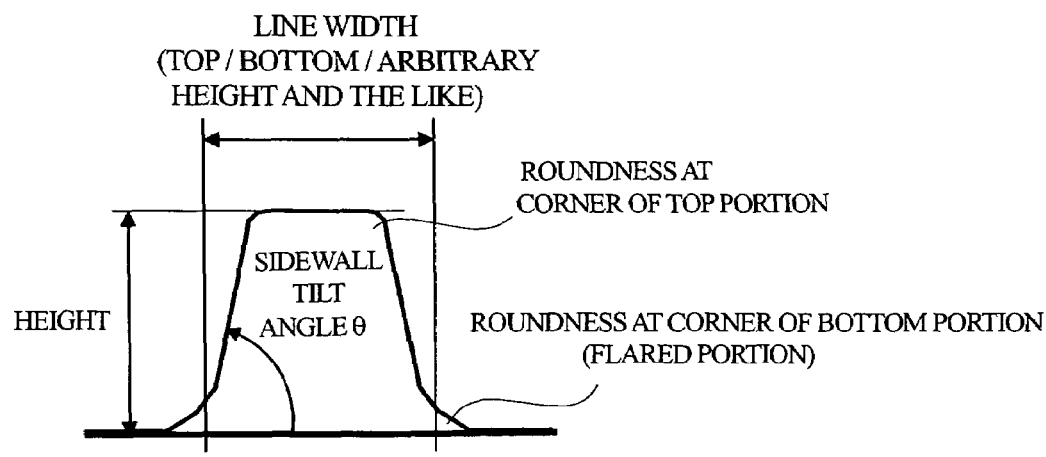
FIG. 3 is an explanatory diagram showing the types of variations in the cross-sectional shape of a pattern in the first embodiment of the present invention.

Next, calculation procedures of solid shape information to be conducted by the image processing unit 300 will be described with reference to FIGS. 3 to 7. As shown in FIG. 3*a*, major kinds of the variations in cross-sectional shape of a pattern include a pattern width (top, bottom, or arbitrary height and the likes), height, sidewall tilt angle, corner roundness (top, bottom) and so forth. The dimension to be measured here is width, and unless otherwise specified, bottom width W is measured in the descriptions of the present invention. In the case of measuring this pattern width W by the use of SEM image, it is necessary to revise the measurement errors shown in FIG. 1 in consideration of the influential shape variations.

In the case where a pattern is formed with using a film made of different material as a stopper like the etching of a gate wire performed with using a gate insulator as a stopper, since the thickness of pattern height is controlled in a film forming process before the pattern forming process by exposure/etching, its variation is sufficiently small and its influence upon dimension measurement is small. Accordingly, in the case of such a pattern, variations of remaining sidewall tilt angles and corner roundness will give relatively large influence to dimension measurement using the SEM image. However, the magnitude of influences that these variations give to the measurement results varies depending on the image processing algorithms to be used in the measurement. In this case, the image processing algorithms to be used in the measurement are image processing techniques as shown in FIG. 14, and it is necessary to select appropriate ones according to the objective patterns.

Figure 4A:
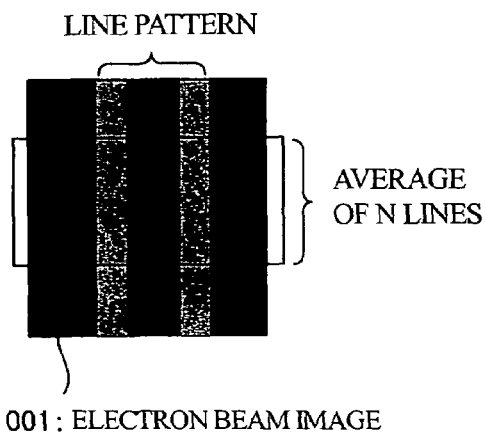
FIG. 4A is an electron beam image showing an area including a line pattern, and the upper stage of FIG. 4B shows a signal waveform of one line pattern, while the lower stage thereof shows an average signal waveform obtained by adding N lines.
Figure 4B:

A method to evaluate this sidewall tilt angle and corner roundness in a quantitative manner will be described. First, as shown in FIGS. 4A and 4B, in order to improve S/N, with regard to acquired electron beam image 001, N lines of one line waveform 002 of each line are averaged to create a smooth line profile 003. This line profile 003 shows signal amount according to sidewall shape of the patter.

Details of the relationship between this signal amount and the cross-sectional shapes of the pattern will be described with reference to FIG. 5. It is known that the secondary electron signal amount of SEM changes in accordance with sidewall tilt angles, and the larger the tilt angle is, the larger the secondary electron signal amount becomes. Therefore, as shown in FIG. 5A, when there is no flared portion in a cross-sectional shape 010 and the entire sidewall keeps a relatively high tilt angle, the line profile 011 increases rapidly from the bottom edge, while as shown in FIG. 5B, when there is a flared portion in a cross-sectional shape 020, the secondary electron signal amount of a flared portion 023 becomes smaller than that of high tilt angle portion (upper portion) 022 having a relatively high tilt angle. Further, also when there is roundness in top corner, the signal amount change of the portion corresponding to a corner becomes smoother than that in the case without roundness ((b) is smoother than (a)). This is because the change of surface tilt angle is moderate, and rapid signal amount increase is restricted by the edge effect because the corner is rounded.

By using these relationships, cross-sectional shape information is acquired in the following procedures. First, by separating the portion with relatively small signal amount and the portion with relatively large signal amount, a cross-sectional shape is divided into a high inclined portion 022 and a flared portion 023, and a top rounding (roundness) portion 024 only by the SEM image observed from the above of a sample (wafer) (see FIG. 5B.). FIG. 6 is detailed explanations of FIG. 5B and FIG. 7 is detailed explanations of FIG. 5A. As shown in FIG. 6, when a primary differential waveform 025 of the obtained line profile 021 is prepared, the waveform having extreme values (DLP1, DLP2) at the positions where lightness changes rapidly in the original line profile 021 is formed. Therefore, the portion between these extreme values DLP1 and DLP2 corresponds to a high tilt angle portion 022 whose tilt angle is relatively high in the sidewall.

Then, the distance between these extreme values is set as a tilt angle index value T. Meanwhile, the distance from the outer extreme value (DLP1) of the differential waveform of an edge portion to the point where the differential waveform becomes zero (DZ1), i.e., the point where it becomes the same lightness as the substrate shows a flared portion where the tilt angle is relatively low. Therefore, the distance between them is set as a flare index value F. Further, the distance from the inner extreme value (DLP2) of differential waveform of an edge portion to the point where the differential waveform becomes zero (DZ2), i.e., to the point where it becomes the same lightness as the top portion represents a top round portion where the tilt angle is relatively low. Therefore, the distance between them is set as a rounding index value R.

Similarly, the result of acquisition of index values of the shape in FIG. 5A is shown in FIG. 7 (primary differential waveform 015) (index values of flared portion and rounding are not illustrated therein). As is seen by the comparison of FIG. 6 and FIG. 7, when the pattern height H is constant, the tilt angle index value T is proportional to tan (π−θ) and becomes smaller as θ becomes closer to vertical. In the case of a reverse taper, the information of sidewall portion vanishes, and only the portion by the edge effect is detected. Accordingly, the tilt angle index value T remains to be a constant value. On the contrary, the flare index value F becomes larger as the flared portion becomes larger, while the rounding index value R becomes larger as roundness becomes larger. In this manner, it is possible to obtain the solid shape information of the pattern by these index values.

Note that the sidewall tilt angle θ can be obtained the following (Equation 1).

$$\theta = \pi/2 - a\tan((T-T0)/H) \quad \text{(Equation 1)}$$

Herein, T0 is a tilt angle index value that is observed when the sidewall tilt angle is 90 degrees (vertical).

In the embodiment described above, the signal waveform is divided into a high tilt angle portion and a low tilt angle portion by the use of primary differential value. However, it is possible to obtain similar effect by dividing the profile waveform area by the value of signal amount itself by using an appropriate threshold value.

As described above, solid shape information of the cross section of the obtained pattern is acquired and is combined with the previously prepared information in a database showing the relationship between the solid shape variations and dimension measurement errors caused by the variations. In this manner, the dimension measurement errors are reduced. In the example of FIG. 1 mentioned above, from SEM image of the measurement objective pattern obtained in the dimension measurement, the sidewall tilt angle θ is estimated by (Equation 1), and the dimension measurement errors may be revised with reference to the database.

Further, instead of using the tilt angle θ itself, feature quantity of an image showing a tilt angle (tilt angle index value T) can be used. In this case, in the same manner as shown in FIGS. 5 to 7, the feature quantity of an image showing tilt angle is calculated also for the electron beam simulation result in the recipe preparation, and the relationship between the feature amount of the image showing this tilt angle and the measurement errors may be recorded into the database instead of the actual θ. As described above, when a database is established by the use of not the actual shape but the same feature quantity of an image as that used in the dimension measurement, a more stable result can be obtained.

By the way, in the first embodiment shown in FIG. 1, only the sidewall tilt angle θ is used as the cross-sectional shape information of a pattern. However, if the variations of roundness of pattern corner portion mentioned above is large or the dimension measurement image processing algorithms to be used tend to be influenced by the variations of the corner roundness, it is necessary to combine the evaluations by the index values thereof. In this case, the relationship between the shape parameters and measurement errors is not two-dimensional like that in FIG. 1, but may be multi-dimensional. At this moment, roundness of corner to be input to the electron beam simulation may be given by, for example, the curvature radius of corner portion. As the shape parameter, the curvature radius input to the simulation may be used as it is, or the feature quantity of an image (flare and rounding index values F and R) calculated from the SEM image signal waveform obtained from the electron beam simulation may be employed.

Further, in the embodiment described above, the relationship between the cross-sectional shape information (for example, sidewall tilt angle) and the measurement errors is recorded into a database. However, in the case where there is the possibility that the image processing conditions may be changed later, a combination of the cross-sectional shapes and the SEM signal waveforms obtained by an electron beam simulation may be recorded, and when determining the image processing conditions, the relationship between the cross-sectional shapes and the dimension measurement errors may be calculated and added also to the database.

In the foregoing, the first embodiment has been described in details with reference to FIGS. 1 to 7, and according to this embodiment, it is possible to revise the errors in the pattern dimension measurement even for the variations of cross-sectional shapes such as pattern sidewall tilt angle. Consequently, highly precise dimension measurement can be realized, and also, the highly precise measurement and highly precise process control using the results thereof can be achieved for the semiconductor patterns which have been scaled down rapidly. In the first embodiment, it is not necessary to minutely carry out a simulation for the establishment of the database to all the possible cross-sectional shape variations, and the number of calculations in the simulation can be smaller in comparison to that in the method in which the libraries are prepared from the simulation result. Furthermore, the database is only referenced to based on the solid shape information estimated from the SEM image, it is advantageous that the number of calculations can be reduced in the measurement.

Second Embodiment

Database Establishment by Actual Sample or AFM

Next, a second embodiment will be described with reference to FIG. 8. In the first embodiment, a database of the relationship between the cross-sectional shapes of the pattern and the dimension measurement errors is established by the use of an electron beam simulation. However, in the second embodiment, an example is shown, in which patterns of various shapes are prepared actually and a database is established by the use of images of these patterns observed actually by SEM.

FIG. 8 shows the procedures of establishing the database. First, patterns for simulating the actually possible process variations according to plural process conditions (exposure condition for a resist pattern, etching condition for an etching pattern, and so forth) are formed (step 1020). Further, SEM images of these patterns are acquired under the same conditions as those at the actual measurement (step 1021), and position detection (dimension measurement) of each edge is carried out under specific image processing conditions (step 1022). Next, in order to evaluate these edge position detection errors, actual cross-sectional shapes are measured by the use of a cross section SEM and an FIB, a TEM and the likes (step 1023). By the use of the cross-sectional shapes obtained in the above-described manner and (true) pattern dimensions, the errors in the line width measurement are calculated (step 1024), and the relationship between these errors and the cross-sectional shapes (for example, sidewall tilt angle) are recorded into a database (step 1025). By doing so, it is possible to establish a database for realizing highly precise dimension measurement without errors due to the variations n the cross-sectional shape in the same manner as in the first embodiment. Note that, the evaluation of the actual cross-sectional shapes may be of course performed by the use of AFM and the like other than the cross section observation.

In the second embodiment, the cost is increased due to the sample preparation and evaluation in comparison to that in the first embodiment. However, it has an advantage that more highly reliable results can be obtained without depending on the performance of an electron beam simulation.

Third Embodiment

Use of Scatterometry

Figure 9:
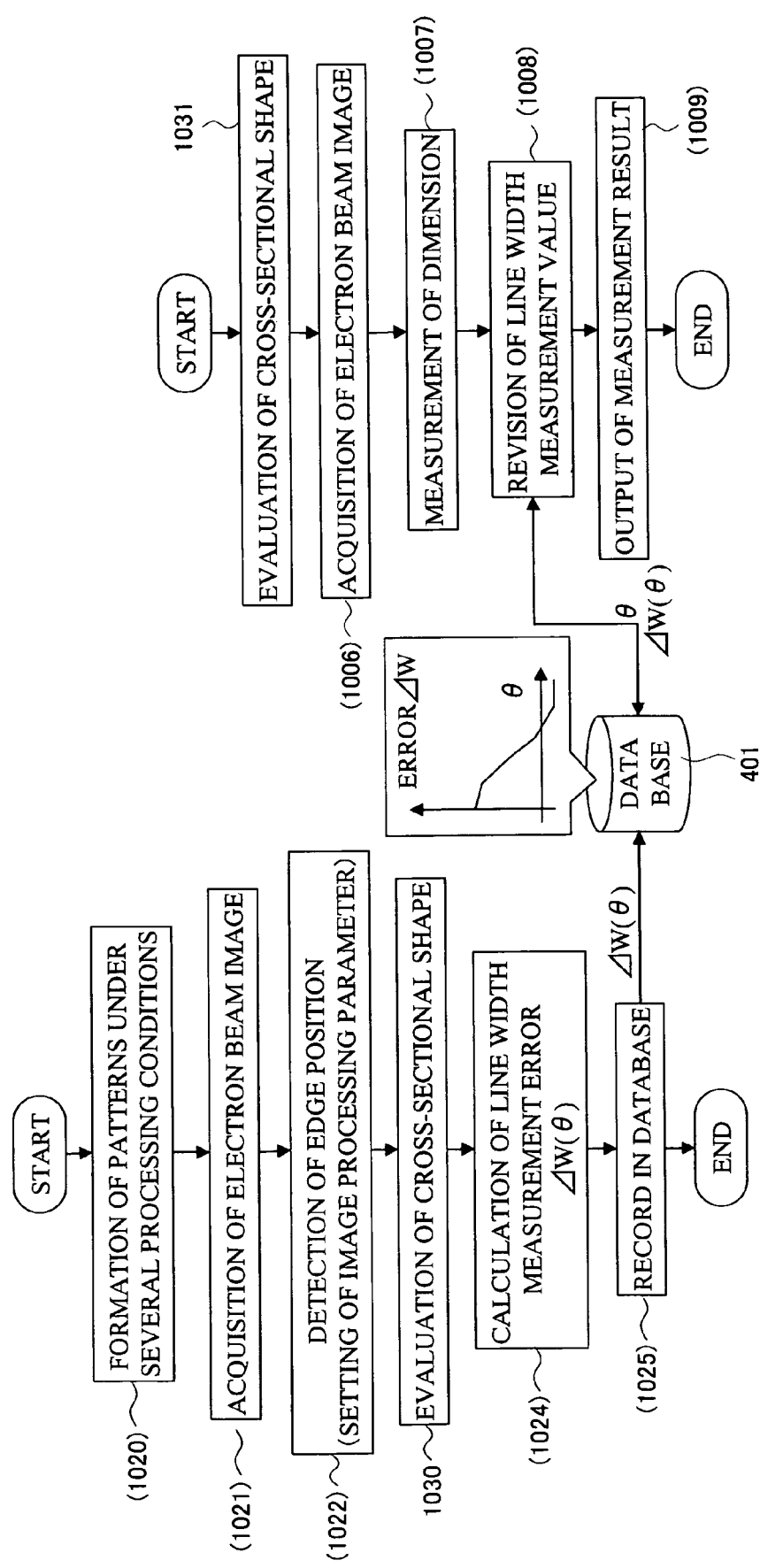

Next, a third embodiment will be described with reference to FIG. 9. In the first embodiment, a database of the relationship between the cross-sectional shapes of the pattern and the dimension measurement errors is established by the use of an electron beam simulation, and the evaluation of the solid shapes of objective patterns is carried out by the use of the feature quantity of the image obtained from SEM images. However, in the third embodiment, an example is shown, in which the establishment of a database and the evaluation of the cross-sectional shape of the pattern in the measurement are carried out by the use of scatterometry (shape evaluation technique using scattered light).

The establishment of a database is carried out in the same manner as in the second embodiment, while the evaluation of cross-sectional shape (step 1030) is carried out not by the cross section observation or AFM but by the scatterometry. In the measurement, first, the evaluation of cross-sectional shape is carried out by scatterometry (step 1031), thereafter, the dimension measurement by an SEM and the error revision are conducted in the same manner as in the first embodiment. Note that the establishment of the database can be carried out by an electron beam simulation in the same manner as in the first embodiment.

By the scatterometry, more detailed cross-sectional shape information can be obtained than by an SEM, but only average information of patterns in a relatively wide area can be obtained. However, in the case where many transistors are arrayed, it is necessary to evaluate these dimensional variations, and the average dimension evaluation is not sufficient. Therefore, by using them in combination as in the third embodiment, in addition to the advantages in the first embodiment, another advantage can be obtained that it is possible to highly and precisely measure the local pattern dimensions at a desired position by the use of more highly reliable cross-sectional shape information.

Fourth embodiment

Setting of Image Processing Condition+GUI, Measurement under Stable Conditions on Premise of Revision Next, a fourth embodiment will be described with reference to FIG. 10. In the first embodiment, details about image processing algorithms for the dimension measurement are not specifically described. However, if the selection of image processing algorithm and designation of measurement position are performed in accordance with a technique shown in the fourth embodiment, it is possible to carry out further highly reliable measurement.

First, screen display for setting the measurement position will be described with reference to FIG. 10. As shown in FIG. 10, a cross-sectional structure 402 of a measurement objective pattern and its SEM image 403 or its signal waveform 404 are displayed side by side on a screen, and a measurement result 405 under designated image processing conditions is displayed on both the images. In this case, the SEM image 403 may be either an actual image or an electron beam simulation image used in the first embodiment. By displaying the images side by side as shown in FIG. 10, it is possible to easily confirm which portion is measured on the signal waveform 404 and the actual cross-sectional structure 402 under the current image processing conditions. Here, the setting of a position on the cross-sectional structure to be actually measured can be easily made by a mouse pointer 406. This measurement position and an actually measured position and the difference therebetween are displayed as the measurement result 405 on the screen. Further, an image processing condition 407 at this moment is also displayed.

Next, a method of setting the image processing conditions by the use of this screen will be described. In the present invention, the cross-sectional shape dependency of the dimension measurement results is revised. Therefore, even if a dimension measurement error is large, revision can be easily made as long as the relationship with the cross-sectional shape is stable. Therefore, besides the prior techniques shown in FIG. 14 such as the threshold method and the likes, the pattern edge detection where the maximum value of an image signal, the minimum value thereof, the maximum value of a differential signal, the minimum value thereof, intersection with zero and so forth are used as the feature points in an image signal is carried out, and the conditions where dimension measurement results are stable are adopted from among these. The determination of algorithms can be achieved by performing an electron beam simulation in consideration of variations of electron beam diameter to be radiated and random noise that occur in actual electron beam radiation and by selecting the dimension measurement algorithms that are stable to these variations.

Consequently, by setting the image processing algorithm and the conditions according to this embodiment, besides the advantages described in the first embodiment, it is possible to realize further stable error revision and highly precise measurement.

Fifth Embodiment

DB Preparation Method, Waveform DB+Condition Change

Next, a fifth embodiment will be described with reference to FIG. 11. In the present invention, the measurement using electron beam images obtained by an SEM is carried out. When acquiring the electron beam image, the radiated primary beam diffuses in a solid matter as a measurement objective, and secondary electrons are generated. As shown in FIGS. 11A and 11B, if the wire width is small in comparison to a diffusion length 408 of the radiated electrons in the solid matter, since the information of the signal waveform at the pattern end is influenced by the edges at the opposite side, it is required to carry out an electron beam simulation in consideration of the dimensions. For example, in the case of the acceleration voltage about 1 keV, since the diffusion length is several tens nm, attention must be paid when the pattern dimension is less than 100 nm (FIG. 11B). On the other hand, when the pattern dimension is sufficiently large in comparison to the diffusion length 408, there is no need to consider dimensions (FIG. 11A).

Accordingly, in the fifth embodiment, diffusion length 408 of electrons in a measurement objective pattern under the conditions of image acquisition is searched in advance by a simulation or an experiment, and in the case of a pattern smaller than that, a database using a simulation in consideration of the dimensions or the result of actual sample evaluation is established, and in the case of a pattern larger than that, a database using a simulation in consideration of only one side edge or the result of actual sample evaluation is established regardless of the dimensions. At this time, a database is prepared for either left edge or right edge, and data may be reversed for the edge at the opposite side. Even in the case of a small dimension, the influence from the edge shape at the opposite side is not so large, though it is necessary to consider the pattern dimension, electron beam simulation waveform may be prepared for only one side edge on assumption that it has a symmetrical shape. Namely, as the input data of the simulation, a pattern having representative dimensions (for example, design dimensions) is formed, while the simulation may be carried out for only one side edge.

As mentioned above, according to the fifth embodiment, since a database is appropriately established in consideration of the electron beam radiation conditions and the dimensions of evaluation objective, it become possible to attain a further highly precise and reliable dimension measurement. Especially, if the patterns are relatively large, it is possible to revise the errors and measure the dimensions of the patterns by the use of the same database even when the patterns have different dimensions.

Sixth Embodiment

Use of Tilt Image, Adapted for Reverse Taper

Next, a sixth embodiment will be described with reference to FIG. 12 and FIG. 13. Since where normal SEM images are employed in the first embodiment, the measurement cannot be made for the sidewall tilt angle exceeding 90 degrees, i.e., for the reverse taper. Therefore, as shown in FIG. 12, the length measuring SEM employed in this embodiment can move on an XY plane and further has a tilt stage 102 provided with a tilt function, and therefore, it can obtain the tilt images, besides the normal top-down view images. Other structures are identical to those in the first embodiment.

In a tilt image, the number of pixels increase at the portion corresponding to the left resist sidewall, while it decreases at the portion corresponding to the right sidewall (in the case where inclination of the tilt stage rises to the right to a sample). Accordingly, this embodiment focuses on a line profile at the portion corresponding to the sidewall on the side where the number of pixels increases. As shown in FIGS. 13A and 13B, by tilting a measurement objective to a beam at a specific angle, an offset according to the tilt angle is made in the feature quantity of an image (tilt angle index value T) showing the tilt angle described in the first embodiment. As a result, it becomes possible to estimate a tilt angle even in the reverse taper. Further, in this embodiment, by acquiring plural images having different tilt angles, the cross-sectional shape of a pattern can be estimated by the principle of stereo vision. As described above, when plural images having different tilt angles are used, it becomes possible to measure the pattern height (or depth). Therefore, for a pattern without etch stopper, it becomes possible to consider the errors in the dimension measurement due to the variations in the pattern height. Note that, instead of tilting a stage, also by tilting a column of an electron optical system or by changing the deflection angle of radiated electron beam, incidence angle to a sample (wafer) can be of course changed.

By the combination of the solid shape evaluation according to this embodiment with the first and second embodiments, in addition to the effects described in the above-described embodiments, the measurement of the patterns having reversely tapered sidewalls and the measurement of the patterns having height variations that cannot be made by the top-down view can be achieved by using the tilt images.

Note that, in the present invention, patterns of wires have been made objectives to be measured in the embodiments mentioned above. However, it is needless to say that it is possible to revise the dimension measurement errors and carry out the highly precise measurement also for other pattern shapes such as holes, trenches, and the likes in the same manner.

Seventh Embodiment

Process Monitor/Control

Next, the process control using the dimension measurement and cross-sectional shape evaluation method according to the present invention will be described in this embodiment. In the embodiments mentioned above, the pattern shape evaluation function and the dimension measurement function are loaded on the SEM 200. However, it is sufficient that the SEM 200 can acquire images, and these functions may be loaded on a system connected via a network. FIG. 17 shows an example of a system connected via a network. The SEM to realize the present invention is connected to various manufacturing apparatus and device characteristic evaluation apparatus all via network and these are connected to an apparatus control system 500 and a QC data collection and analysis system 501. The manufacture history is controlled by a manufacture history control system 504.

A defect monitoring system 502 monitors the defects in them, and a manufacturing line controller 505 can easily confirm the condition of the manufacturing line via a display and communication unit 503. The dimension measurement of the present invention can be executed by the use of an existing SEM in a manufacturing line. Since the system is connected to the manufacturing apparatus via a network, by setting the normal dimensions and shape variation range in advance, a warning can be sent to the line controller immediately when a defect exceeding them occurs. Further, by registering the related manufacturing apparatus in advance, the manufacture can be stopped automatically to prevent the defective products from being manufactured.

Furthermore, by registering the target values of the dimension measurement and the solid shape evaluation result according to the present invention and the process conditions to revise the deviated amounts from the target values (etching conditions and exposure conditions) in advance into the QC data collection and analysis system 501 or the apparatus control system 500, the processes can be controlled by the apparatus control system 500 so as to revise the variations in the pattern dimensions and pattern shape. In this manner, by controlling each apparatus so as to revise process variations, it becomes possible to always process the patterns highly precisely and to enhance the yield of a semiconductor manufacturing line.

According to the present invention, it is possible to realize highly precise measurement in which errors in dimensions depending on the pattern solid shapes are removed. As a result, it is possible to carry out a highly precise process control.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of measuring pattern dimensions, comprising the steps of:
evaluating a relationship between dimensions measured from a cross-sectional shape of a pattern and dimensions measured from an image of the pattern acquired by using a SEM to each of plural patterns having various shapes which are made as measurement objective patterns, and storing relationships evaluated to each of the plural patterns;
conducting dimension measurement of an objective pattern from an image of the objective pattern acquired by using the SEM and estimating a cross-sectional shape of the objective pattern from the image of the objective pattern acquired by using the SEM; and
revising errors of the dimension measurement of the objective pattern based on the stored relationship between the dimensions measured from the cross-sectional shapes of the plural patterns and the dimensions measured from the images of each of the plural patterns having various shapes previously evaluated by using information on cross-sectional shape of the objective pattern estimated from the image of the objective pattern acquired by using the SEM.

2. An apparatus for measuring pattern dimensions, comprising:
a measurement unit which conducts an actual measurement of an objective pattern so as to obtain a dimension measurement by processing image signals of the objective pattern obtained by a microscope and estimating a cross-sectional shape of the objective pattern from the image signals;
an evaluating unit which evaluates, to each of plural patterns having various shapes which are made as the measurement objective pattern, a relationship between dimensions measured from a cross-sectional shape of a pattern and dimensions measured from an image of the pattern and dimensions measured by an image of the pattern obtained by the microscope; and
a revising unit which revises errors of the dimension measurement of the objective pattern conducted by the measurement unit based on the relationship between the dimensions measured from the cross-sectional shape of the pattern and the dimensions measured from the image of the pattern evaluated in advance by the evaluating unit by using information on cross-sectional shape of the objective pattern estimated from the image by the measurement unit.

3. An apparatus for measuring pattern dimensions according to claim 2, wherein the microscope is a scanning electron microscope.

4. The apparatus for measuring pattern dimensions according to claim 3,
further comprising a database in which the relationship between measurement errors between a pattern position detected by the specific image processing technique and actual position of the pattern and the cross-sectional shapes of said pattern is evaluated and recorded in advance is established, and cross-sectional shapes of said evaluation objective pattern are evaluated and the position of said evaluation objective pattern is detected by said specified image processing technique, and measurement errors in the case of measuring the evaluation objective patterns having said cross-sectional shapes are estimated and said measurement errors are revised based on the relationship between said pattern cross-sectional shapes and said measurement errors recorded in advance into said database.

5. The apparatus for measuring pattern dimensions according to claim 4, wherein said cross-sectional shape includes one of a tilt angle of a sidewall, roundness of a corner of pattern top portion, and roundness of a corner of pattern bottom portion, or a combination thereof.

6. The apparatus for measuring pattern dimensions according to claim 4, wherein said database is established by an electron beam simulation, a cross section measurement, an AFM measurement, or a measurement by scatterometry.

7. The apparatus for measuring pattern dimensions according to claim 4, wherein said evaluation of cross-sectional shapes in said actual dimension measurement is carried out by scatterometry, or by the use of feature quantity of an image calculated from SEM images.

8. The apparatus for measuring pattern dimensions according to claim 4, wherein cross-sectional structure information of an objective to be measured and electron beam images and/or waveforms thereof obtained from an SEM observation of said cross-sectional structure or a simulation that simulates the SEM observation are displayed side by side, and a position of the pattern detected by designated image processing conditions is displayed on said cross-sectional structure and said electron beam images or said waveforms, thereby adjusting image processing conditions.

9. The apparatus for measuring pattern dimensions according to claim 4, wherein said specified image processing technique uses dimension measurement image processing algorithms or image processing parameters in which variations due to noises or SEM device parameters are small.

10. The apparatus for measuring pattern dimensions according to claim 4, wherein the relationship between said pattern cross-sectional shapes and said dimension measurement errors is recorded in the form of functions into the database.

11. The apparatus for measuring pattern dimensions according to claim 4, wherein, with regard to the establishment of said database, the relationship between said pattern cross-sectional shapes and signal waveforms obtained from actual images or an electron beam simulation is recorded, and after determining image processing algorithms and parameters of dimension measurement, the relationship between said cross-sectional shapes and said dimension measurement errors are calculated based on a combination of said cross-sectional shapes and said signal waveforms, and recorded into said database.

12. The apparatus for measuring pattern dimensions according to claim 4, wherein cross-sectional shapes of said evaluation objective pattern are evaluated by the use of plural electron beam signals in which angles between an electron beam emitted from said scanning electron microscope and a surface of the measurement sample are different.

13. An apparatus for measuring pattern dimensions, comprising:
a scanning electron microscope unit which irradiates and scans a converged electron beam on a surface of a specimen on which plural patterns including an objective pattern are formed and obtains image signals;
a dimension measurement unit to measure dimensions of the objective pattern by processing image signals of the objective pattern obtained by the scanning electron microscope unit and estimating a cross-sectional shape of the objective pattern from the image signals;
an evaluating unit which evaluates, to each of plural patterns of various shapes which are made as the measurement objective pattern, a relationship between dimensions measured from a cross-sectional shape of a pattern and dimensions measured from an image of the pattern obtained by the scanning electron microscope unit; and a revising unit which revises errors of a dimension measurement of the objective pattern measured by the dimension measurement unit based on the relationship between the dimensions measured from the cross-sectional shape of the pattern and the dimensions measured from the image of the pattern evaluated to plural patterns in advance by the evaluating unit by using information on cross-sectional shape of the objective pattern estimated from the image by the dimension measurement unit.

14. The apparatus for measuring pattern dimensions according to claim 13, further comprising a database in which the relationship between measurement errors between a pattern position detected by the specific image processing technique and actual position of the pattern and the cross-sectional shapes of said pattern is evaluated and recorded in advance is established, and cross-sectional shapes of said evaluation objective pattern are evaluated and the position of said evaluation objective pattern is detected by said specified image processing technique, and measurement errors in the case of measuring the evaluation objective patterns having said cross-sectional shapes are estimated and said measurement errors are revised based on the relationship between said pattern cross-sectional shapes and said measurement errors recorded in advance into said database in said.

15. The apparatus for measuring pattern dimensions according to claim 14, wherein said cross-sectional shape includes one of a tilt angle of a sidewall, roundness of a corner of pattern top portion, and roundness of a corner of pattern bottom portion, or a combination thereof.

16. The apparatus for measuring pattern dimensions according to claim 14, wherein said database is established by an electron beam simulation, a cross section measurement, an AFM measurement, or a measurement by scatterometry.

17. The apparatus for measuring pattern dimensions according to claim 14, wherein said evaluation of cross-sectional shapes in said actual dimension measurement is carried out by scatterometry, or by the use of feature quantity of an image calculated from SEM images.

18. The apparatus for measuring pattern dimensions according to claim 14, wherein cross-sectional structure information of an objective to be measured and electron beam images and/or waveforms thereof obtained from an SEM observation of said cross-sectional structure or a simulation that simulates the SEM observation are displayed side by side, and a position of the pattern detected by designated image processing conditions is displayed on said cross-sectional structure and said electron beam images or said waveforms, thereby adjusting image processing conditions.

19. The apparatus for measuring pattern dimensions according to claim 14, wherein said specified image processing technique uses dimension measurement image processing algorithms or image processing parameters in which variations due to noises or SEM device parameters are small.

20. The apparatus for measuring pattern dimensions according to claim 14, wherein the relationship between said pattern cross-sectional shapes and said dimension measurement errors is recorded in the form of functions into the database.

21. The apparatus for measuring pattern dimensions according to claim 14, wherein, with regard to the establishment of said database, the relationship between said pattern cross-sectional shapes and signal waveforms obtained from actual images or an electron beam simulation is recorded, and after determining image processing algorithms and parameters of dimension measurement, the relationship between said cross-sectional shapes and said dimension measurement errors are calculated based on a combination of said cross-sectional shapes and said signal waveforms, and recorded into said database.

22. The apparatus for measuring pattern dimensions according to claim 14, wherein cross-sectional shapes of said evaluation objective pattern are evaluated by the use of plural electron beam signals in which angles between an electron beam emitted from said scanning electron microscope and a surface of the measurement sample are different.

* * * * *